United States Patent
Tobben et al.

(10) Patent No.: US 6,492,282 B1
(45) Date of Patent: Dec. 10, 2002

(54) INTEGRATED CIRCUITS AND MANUFACTURING METHODS

(75) Inventors: Dirk Tobben, Fishkill, NY (US); Peter Weigand, Croton on Hudson, NY (US); Matthias Ilg, Fishkill, NY (US)

(73) Assignee: Siemens Aktiengesellschaft, Munich (DE)

( * ) Notice: Subject to any disclaimer, the term of this patent is extended or adjusted under 35 U.S.C. 154(b) by 726 days.

(21) Appl. No.: 08/846,925

(22) Filed: Apr. 30, 1997

(51) Int. Cl.$^7$ ............................................. H01L 21/316
(52) U.S. Cl. ................. 438/760; 438/780; 438/795; 438/564
(58) Field of Search ............................. 438/760, 761, 438/763, 766, 514, 778, 783, 784, 780, 781, 789, 790, 471, 473, 476, 477, 564, 565, 433, 795

(56) References Cited

U.S. PATENT DOCUMENTS

| | | | |
|---|---|---|---|
| 5,162,241 A | * 11/1992 | Mori et al. | 438/760 |
| 5,268,333 A | * 12/1993 | Lee et al. | 438/760 |
| 5,286,681 A | * 2/1994 | Maeda et al. | 438/760 |
| 5,310,720 A | * 5/1994 | Shin et al. | 438/760 |
| 5,455,205 A | * 10/1995 | Umimoto et al. | 438/760 |
| 5,478,758 A | * 12/1995 | Ester | 438/476 |
| 5,496,776 A | 3/1996 | Chien et al. | 437/231 |
| 5,605,867 A | * 2/1997 | Sato et al. | 438/761 |
| 5,616,513 A | * 4/1997 | Shepard | 438/473 |
| 5,656,555 A | * 8/1997 | Cho | 438/760 |
| 5,728,630 A | * 3/1998 | Nishimura et al. | 438/790 |
| 5,795,820 A | * 8/1998 | Kepler | 438/740 |

OTHER PUBLICATIONS

European Search Report, EP 0 766 291, Apr. 2, 1997, EPO.

* cited by examiner

Primary Examiner—Savitri Mulpuri
(74) Attorney, Agent, or Firm—Stanton Braden

(57) ABSTRACT

A method of filling gaps between adjacent gate electrodes of a semiconductor structure. A self-planarizing material is deposited over the structure. A first portion of such material flow between the gate electrode to fill the gaps and a second portion of such material becomes deposited over tops of the gate electrodes and over the gaps to form a layer with a substantially planar surface. A phosphorous dopant is formed in the second portion of the self-planarizing material. Thus, relatively small gaps may be filled effectively with a layer having a very planar surface for subsequent photolithography. The phosphorous dopant provides gettering to remove adverse effects of alkali contaminant ions which may enter the gap filling material. The dielectric constant of the material filing the gaps, i.e., the first portion of the gap filling material, being substantially free of such contaminants, has a relatively low dielectric constant thereby reducing electrical coupling between adjacent electrodes. The self-planarizing material is a flowable material. The flowable oxide may be spun on or may be deposited by gaseous deposition. The phosphorous dopant may be provided by, for example: implanting phosphorous ions into the second portion of the self-planarizing layer and heating the material to both cure such material and activate the phosphorous ions; depositing a phosphorous doped layer over the layer of self-planarizing material, heating the structure to out-diffuse the phosphorous dopant into the second portion of the self-planarizing material and selectively removing the deposited layer; or by curing the spun-on self-planarizing material in a phosphine environment.

6 Claims, 3 Drawing Sheets

INTEGRATED CIRCUITS AND MANUFACTURING METHODS

BACKGROUND OF THE INVENTION

This invention relates generally to integrated circuits and manufacturing methods and more particularly to structures and methods having improved planarity and alkali ion gettering properties.

As is known in the art, in forming small line width geometries in a semiconductor process using photolithography, it is necessary to provide a highly planar surface for various photolithographic masks used in such process. Further, in the fabrication of dynamic random access memories (DRAMs) a plurality of gate electrodes are formed adjacent one another with relative small separation, i.e., gaps, between each adjacent pair thereof. Thus, it is necessary to fill these gaps width a suitable material, preferably a material with a low dielectric constant to prevent coupling between the adjacent electrodes as well as to provide a planar surface for subsequent photolithography.

With one process, after the gate electrodes are formed, a dielectric layer of silicon nitride is chemically vapor deposited (CVD) over the surface. The CVD silicon nitride is a conformal deposition and therefore gaps remain between adjacent gate electrode structures. The gap width between gate electrode structures after the layer of silicon nitride is deposited is in the order of 1200 Å. Next, a layer of boron phosphorous doped glass (BPSG) is chemically vapor deposited over the structure to fill in the gaps. The CVD BPSG is thick enough to not only fill the gaps but also extends over the tops of the CVD silicon nitride layer and over the filled gaps to a thickness in the order of 4000 Å–5000 Å.

As is also known in the art, contaminants, such as sodium ions, or other alkali ions may come into contact with the outer BPSG layer. However, the phosphorous in the BPSG layer acts as a gettering material to counteract the effect of the alkali ion contaminant. The structure is then heated to form a more planar surface. However, because of high degree of planarity required for the subsequent photolithographic processing, e.g. metal layer patterning into electrically conductive wires, relatively expensive chemical mechanical polishing (CMP) may be required to form a surface with the requisite degree of planarity.

SUMMARY OF THE INVENTION

The invention relates to the filling of gaps such as those between adjacent gate electrodes of a semiconductor structure. In one embodiment, a self-planarizing material is deposited over the structure. A first portion of such material flows between the gate electrodes to fill the gaps and a second portion of such material becomes deposited over tops of the gate electrodes and over the gaps to form a layer with a substantially planar surface. A dopant, here phosphorous, is formed in the second portion of the self-planarizing material.

In accordance with the invention, relatively small gaps may be filled effectively with a layer having a very planar surface for subsequent photolithography. Further, the phosphorous dopant provides gettering to remove adverse effects of alkali contaminant ions which may enter the gap filling material. Still further, the dielectric constant of the material filling the gaps, i.e., the first portion of the gap filling material, being substantially free of such contaminants, has a relatively low dielectric constant thereby reducing electrical coupling between adjacent electrodes.

In accordance with one feature of the invention, the self-planarizing material is a flowable material. The phosphorous dopant may be provided by, for example: implanting phosphorous ions into the second portion of the self-planarizing layer and heating the material to both cure such material and activate the phosphorous ions; depositing a phosphorous doped layer over the layer of self-planarizing material, heating the structure to out-diffuse the phosphorous dopant into the second portion of the self-planarizing material and then selectively removing the deposited layer; or by curing the spun-on self-planarizing material in a phosphine environment.

BRIEF DESCRIPTION OF THE DRAWING

Other features of the invention, as well as the invention itself, may be more fully understood with reference to the following detailed description taken together with the accompanying drawings, in which:

FIGS. 1–4 are diagrammatical, cross sectional sketches of a semiconductor integrated circuit structure fabricated in accordance with the invention; FIG. 1 showing a plurality of gate electrodes disposed over a semiconductor substrate; FIG. 2 showing the structure of FIG. 1 after such structure has spun over a surface thereof a self-planarizing material, a first portion of such material flowing between the gate electrodes to fill the gaps and a second portion of such material becoming deposited over tops of the gate electrodes and over the gaps to form a layer with a substantially planar surface; FIG. 4 showing a phosphorous dopant formed in the second portion of the self-planarizing material after either: annealing the phosphorous ions implanted therein in accordance with FIG. 3A, or after out-diffusion of dopant in the phosphorous doped layer in FIG. 3B, or after curing the self-planarizing material in a phosphine atmosphere in accordance with a third embodiment of the invention.

DETAILED DESCRIPTION

Figure 1:
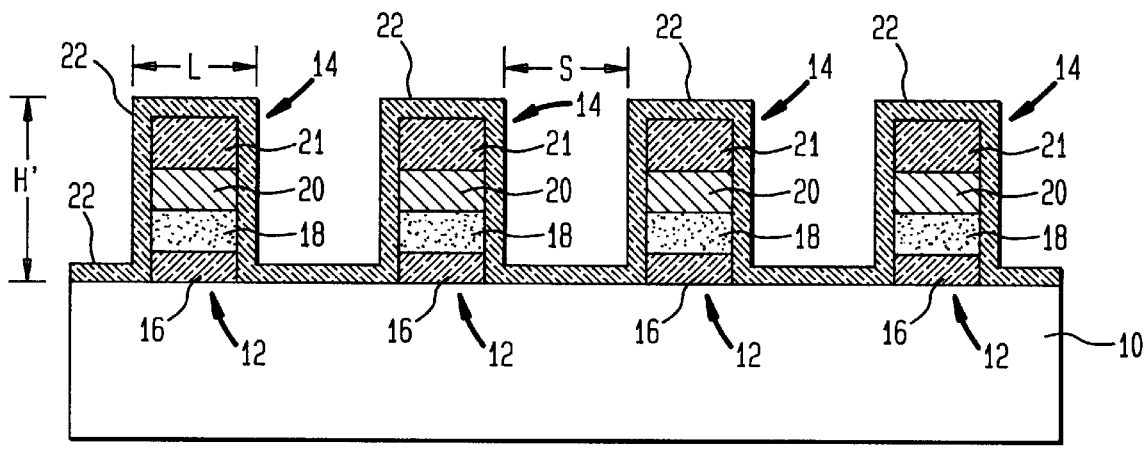

Referring now to FIG. 1, a semiconductor substrate 10, here silicon, has formed over the upper surface thereof a plurality of MOS transistors 12. Each one of the transistors 12 has source and drain regions (not shown) with a corresponding one of a plurality of gate electrodes 14 disposed between each of the source and drain regions. Illustratively, each gate electrode 14 includes a bottom layer 16 comprising, for example, thermally grown silicon dioxide, a layer 18 of doped, low pressure chemical vapor deposited (LP CVD) polycrystalline silicon formed on the silicon dioxide layer 16, a layer 20 of chemically vapor deposited tungsten-silicide formed on the polycrystalline silicon layer 18 and a top layer 21 of silicon nitride. The height H' of the gate stack (i.e., layers 16, 18, 20, and 21) is about 4000 Å to 5000 Å. After forming the gate stack, a silicon nitride liner 22 is chemically vapor deposited over surface of the structure. Here, the silicon nitride liner 22 has a thickness of about 300 Å. Further, here the length (L) of the gate electrodes 14 (i.e., the across the outer sidewalls of the silicon nitride liner 22) is in the order of about 1800 Å and the space (S) between adjacent gate electrodes 14 (i.e., the distance between the outer sidewall of the adjacent silicon nitride liners 22) is in the order of about 1200 Å.

Figure 2:
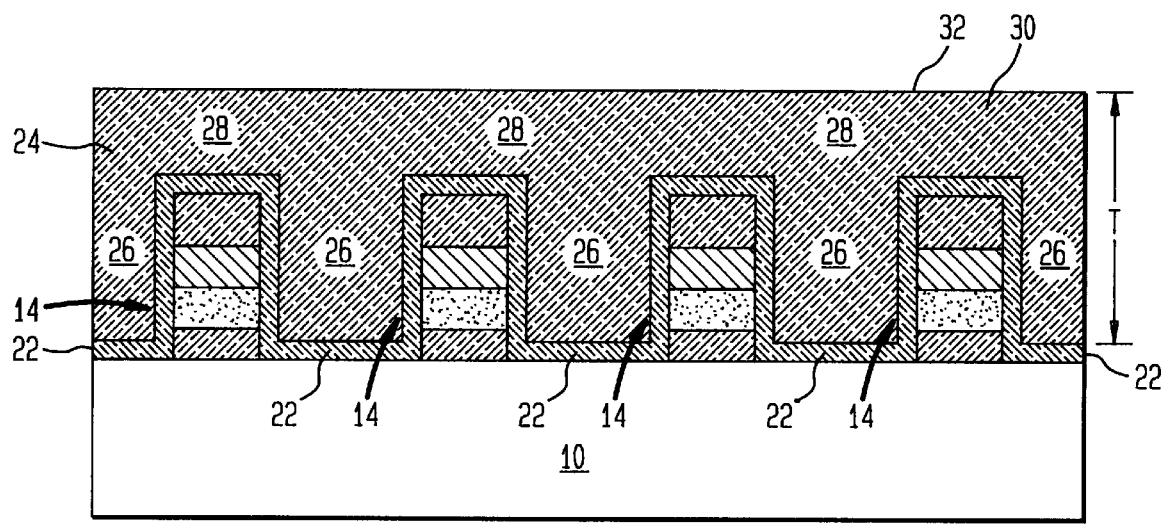

After patterning the gate electrodes 4, as shown in FIG. 1, using conventional photolithographic etching techniques, a self-planarizing material 24 is spun over the surface of the structure, as shown in FIG. 2. The material 24 is a flowable oxide. In one embodiment, the flowable oxide is, for example, hydrogensilsesquioxane glass (FOx material) manufactured and sold by Dow-Corning, Midland, Mich. When such flowable oxide material 24 is spun, it is self-planarizing and a first, lower portion 26 of the material 24 flows between the gate electrodes 14 to fill the gaps between adjacent gate electrodes 14 and a second, upper portion 28 of the material 24 becomes deposited over tops of the gate electrodes 14 and the filled gaps between adjacent gate electrodes 14 to form a layer 30 with a substantially planar surface 32, as shown in FIG. 2. The thickness (T) of the self-leveling material is sufficient to provide isolation between the gate and the conductive layer (not shown) above the self-leveling material. In one embodiment, T is in the order of 6000 Å. Since the gate stack is about 4000 Å, the thickness of the self-leveling material in region 28 is about 2000 Å.

Figure 4:
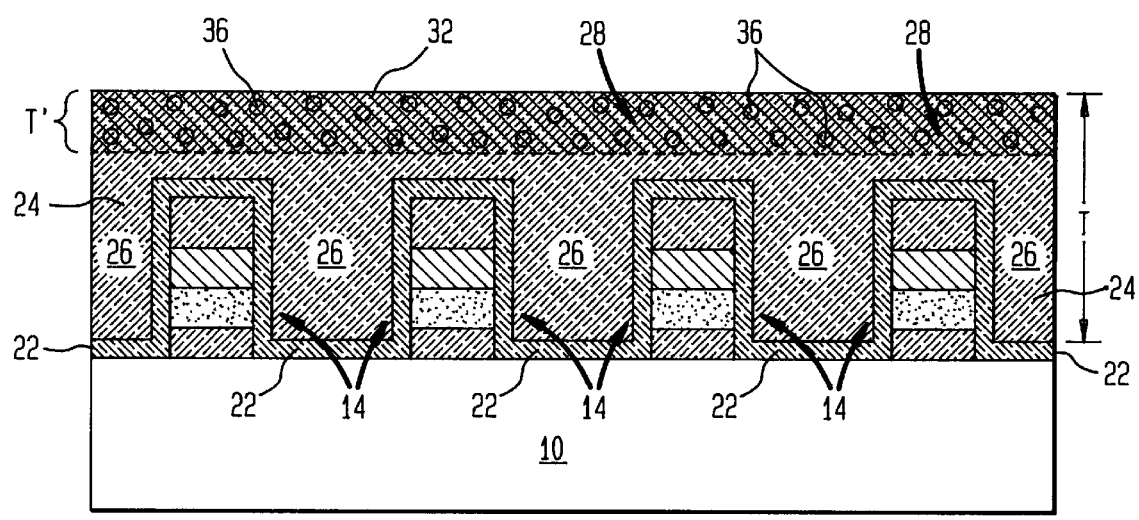

Referring to FIG. 4, an alkali ion gettering dopant 36, such as phosphorous, is provided in the second, upper portion 28 of the self-planarizing material 14.

Figure 3A:
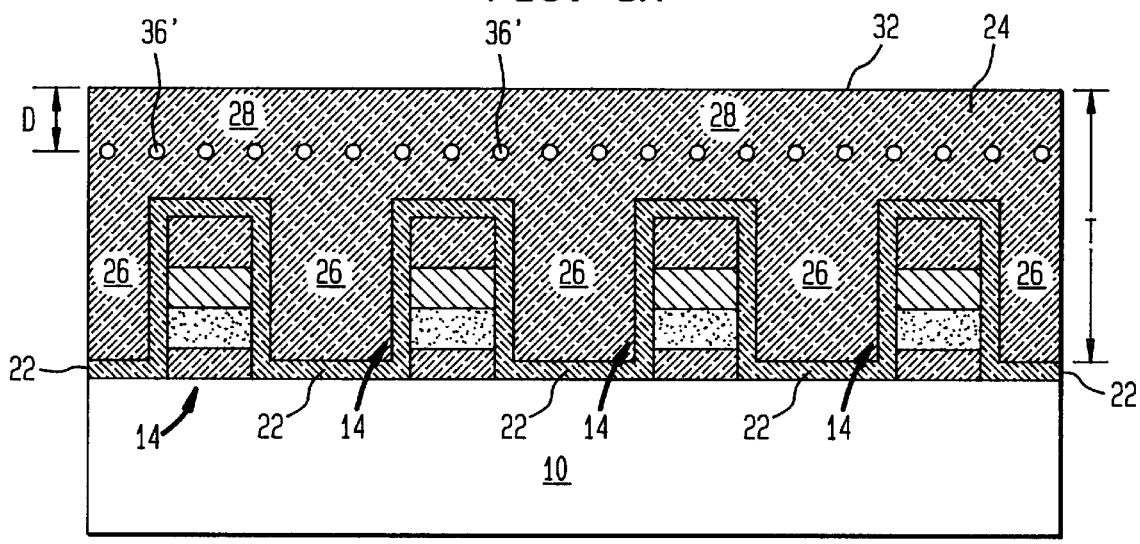
FIG. 3A showing ion implantation of phosphorous ions into the second portion of the self-planarizing material in accordance with one embodiment of the invention.

FIG. 3A shows one technique of providing phosphorous dopant 36' in the second, upper portion 28 of the self-planarizing material. The phosphorous ions 36' are implanted into the second, upper portion 28 of the self-planarizing material 24. The dosage and energy level are selected so that ions 36' are implanted to a depth (D) located in the second, upper portion 28. In one embodiment, D is in the order of about 1000 Å from the upper, planar surface 32 of the self-planarizing material 24 and the dopant concentration is about 2% to 6% by weight of the material 24. Preferably, the dopant concentration is about 2% to 5% by weight of the material 24, more preferably about 2% to 4% by weight of the material 24.

In one embodiment, the ion implantation is performed prior to the curing the self-planarizing material 24. The implanted ions require activation by a relatively high temperature anneal. Generally, the self-planarizing material 24 is cured at a temperature of 400° C. to 900° C. for about 60 minutes in a nitrogen atmosphere. Thus, implanting the ions prior to curing advantageously uses the curing process to serve two purposes, curing the material and activating the ions.

Figure 3B:
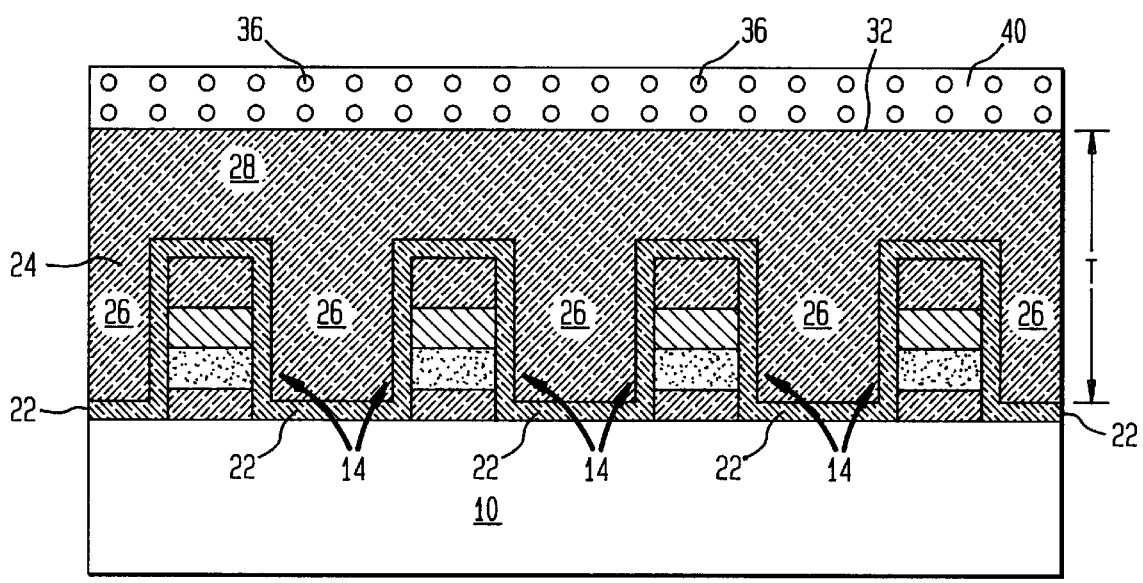
FIG. 3B showing a doped layer with phosphorous dopant disposed on the self-planarizing layer in accordance with another embodiment of the invention.

FIG. 3B shows an alternative technique for providing the phosphorous dopant 36 in the second, upper portion 28 of the self-planarizing material 24. As shown, a layer 40 of polycrystalline silicon (poly) having phosphorous dopant 36 is chemically vapor deposited over the surface 32 of the self-planarizing material 24. The doped polycrystalline layer 40 has a doping concentration sufficient to provide adequate dopant concentration in the upper portion of the self-planarizing material. In one embodiment, the doping concentration of the poly is at least about $10^{20}$ atoms/cm$^3$.

The doped poly layer 40 is deposited on the self-planarizing material 24 prior to curing of such material 24 to take advantage of the curing process to activate the dopants. The material is cured to sufficiently cause the phosphorous dopant 26 in the polycrystalline silicon layer 40 to outdiffuse into the second, upper portion 28 of the self-planarizing material 24. As shown, the peak concentration of dopants is about 500 Å–1000 Å below the surface of the self-planarizing material 24. In one embodiment, the material is cured by baking the structure at a temperature of about 900° C. for about one hour in a nitrogen, or vacuum, atmosphere. Next, the doped polycrystalline silicon layer 40 is removed by selective reactive ion etching (RIE).

Another technique for providing the forming the phosphorous dopant 36 in the second, upper portion 28 of the self-planarizing material 24 is by curing the self-planarizing material 24 in a phosphine atmosphere. After the self-planarizing material 24 is spun over the surface of the structure, the structure is placed in an oven having a phosphine atmosphere. The structure is baked in such oven at a temperature of 400° C. to 900° C. for a time in the order of sixty minutes. The phosphorous in the phosphine gas diffuses into the second, upper portion 28 of the self-planarizing material 24. The peak concentration of the dopant concentration is about 500 Å to 1000 Å below the surface of the self-planarizing material.

Thus, with the invention described above, while contaminants, such as sodium ions, or other alkali materials may come into contact with the second, upper portion 28 of the cured, self-planarizing material 24, the phosphorous dopant 36 in the second, upper portion 28 of the self-planarizing material 24 acts as a gettering material to counteract the effect of the alkali ion contaminant. Further, the structure shown in FIG. 4 is highly planar as required for subsequent photolithographic processing, for example in forming upper metalization layers, or electrically conductive interconnecting wires, not shown. That is, the invention effectively fills relatively small gaps, such as between adjacent gate electrodes, with a layer having a very planar surface for subsequent photolithography. Further, the phosphorous dopant provides gettering to remove adverse effects of alkali ion contaminant ions which may enter the gap filling material. Still further, the dielectric constant of the material filing the gaps, i.e., the first, lower portion 26 of the gap filling material 24, being substantially free of such contaminants, has a relatively low dielectric constant (i.e., in the order of 3.6 to 4.0) thereby reducing electrical coupling between adjacent gate electrodes.

Other embodiments are within the spirit and scope of the appended claims. For example, other flowable materials may be spun-on the structure shown in FIG. 1. Thus, while the hydrogensilsesquioxane glass, (e.g. FOx material) has been used above, other self-leveling and temperature-resistant silica films with reduced density, for example, spun-on silica aerogel, may be used. Still further, the self-leveling layer may be formed using a gaseous deposition process with similar flow properties as that obtained with the spun on glass material described above instead of using such spin deposited process. One such material which may be used with gaseous deposition is Flowfill material sold by PMT-Electrotech, Chatsworth, Calif.

What is claimed is:

1. A method of filling gaps between adjacent gate electrodes of a semiconductor structure, comprising the steps of:

depositing a self-planarizing material over the structure, a first portion of such material flowing between the gate electrode to fill the gaps and a second portion of such material being deposited over tops of the gate electrodes and the filled gaps to form a layer with a substantially planar surface;

providing a phosphorous dopant in the second portion of the self-planarizing material; and wherein the phosphorous dopant providing step includes the step of implanting phosphorous ions into the second portion of the self-planarizing material and heating the material to both cure such material and to activate the phosphorous ions.

2. The method recited in claim 1 wherein the self-planarizing material is a flowable material.

3. The method recited in claim 2 wherein the flowable material is an oxide.

4. The method recited in claim 2 or 3 wherein the flowable material is spun over the structure.

5. The method recited in claim 2 or 3 wherein the flowable material is deposited using a gaseous deposition over the structure.

6. The method recited in claim 4 wherein the flowable material is hydrogensilsesquioxane glass.

* * * * *